United States Patent [19]

Hwang

[11] Patent Number: 5,773,366
[45] Date of Patent: Jun. 30, 1998

[54] METHOD FOR FORMING WIRING

[75] Inventor: Sung Bo Hwang, Ichon, Rep. of Korea

[73] Assignee: Hyundai Electronics Industries Co., Ltd., Kyoungki-do, Rep. of Korea

[21] Appl. No.: 659,884

[22] Filed: Jun. 7, 1996

[30] Foreign Application Priority Data

Jun. 16, 1995 [KR] Rep. of Korea ...................... 95-16038

[51] Int. Cl.$^6$ .................................................... B44C 1/22
[52] U.S. Cl. .......................... 438/718; 438/720; 438/736; 438/742
[58] Field of Search ................................... 438/718, 720, 438/736, 742

[56] References Cited

U.S. PATENT DOCUMENTS

| | | | |
|---|---|---|---|
| 4,786,360 | 11/1988 | Cote et al. | 438/742 |
| 4,925,524 | 5/1990 | Beatty | 156/643 |
| 4,948,462 | 8/1990 | Rossen | 438/720 |
| 4,997,520 | 3/1991 | Jucha et al. | 438/720 |
| 5,108,542 | 4/1992 | Lin | 438/720 |
| 5,164,331 | 11/1992 | Lin et al. | 438/742 |
| 5,338,702 | 8/1994 | Kobeda et al. | 438/720 |
| 5,521,119 | 5/1996 | Chen et al. | 438/720 |

*Primary Examiner*—Roland Martin
*Attorney, Agent, or Firm*—Gary M. Nath; Nath & Associate

[57] ABSTRACT

A method for forming a tungsten wiring, wherein an etch barrier layer is formed on an area where a metal wiring will be formed, using chlorine-based plasma so that the etch barrier layer is used as a mask upon forming a metal wiring, thereby eliminating a limitation on the thickness of the tungsten junction layer. the method includes the steps of sequentially forming a tungsten junction layer and a tungsten film over a semiconductor substrate, forming a negative type photoresist film pattern using a metal wiring mask, forming a copper thin film on a selectively exposed portion of the tungsten film, growing the copper thin film in a chlorine-based plasma atmosphere, thereby forming a copper chloride thin film, removing the photoresist film pattern, sequentially etching the tungsten film and tungsten junction layer using the copper chloride thin film as a mask, and removing the copper chloride thin film, thereby forming a tungsten wiring. The method provides a sufficient process margin, thereby achieving an improvement in the reliability of semiconductor devices and a high integration of semiconductor devices.

22 Claims, 2 Drawing Sheets

METHOD FOR FORMING WIRING

BACKGROUND OF THE INVENTION

1. Field of the Invention

The present invention relates to a method for forming a tungsten wiring, and more particularly to techniques for changing a copper thin film into a copper chloride (CuClx) film with an increased thickness, thereby forming a tungsten wiring.

2. Description of the Prior Art

In order to form such a tungsten wiring, various methods have been used. For example, a tungsten junction layer with a multilayer structure consisting of titanium/titanium nitride (Ti/TiN) films is formed on a semiconductor substrate to obtain a tungsten wiring. A tungsten film is then formed over the tungsten junction layer. Over the tungsten film, a photoresist film pattern is formed in accordance with an etch process using a metal wiring mask. Using the photoresist film pattern as a mask, the tungsten film and tungsten junction layer are then sequentially etched, thereby forming a tungsten wiring.

In accordance with this technique, the etching of the tungsten film is carried out using fluorine-based plasma ($SF_6$ and $C_2F_6$). This etching is also carried out at a low etch selectivity between the tungsten film and photoresist film pattern. Meanwhile, the photoresist film pattern exhibits a resistance increasing in inverse proportion to a decrease in the thickness of the pattern itself. Such an increase in resistance results in a vast increase in power consumption. Furthermore, where the photoresist film pattern has a small thickness, it is difficult to subsequently form a pattern with a narrow pitch using a lithography process. In this case, the process margin also becomes small.

In order to solve such drawbacks resulting from the small thickness of the photoresist film pattern, another method has been proposed which involves depositing a titanium nitride over the above-mentioned tungsten film in order to achieve a high etch selectivity between the photoresist film pattern and titanium nitride film upon forming a tungsten wiring. In accordance with this method, it is possible to increase the thickness of the photoresist film pattern because the titanium nitride is used as a mask. However, the tungsten junction layer may have a limitation on its thickness due to the titanium nitride film in the case of simultaneously etching the titanium nitride film, tungsten film and tungsten junction layer at the etching step for forming the metal wiring. This results in a small process margin and difficulty in process control, thereby degrading the reliability of finally obtained semiconductor devices. It is also difficult to achieve a high integration of semiconductor devices.

SUMMARY OF THE INVENTION

Therefore, an object of the invention is to provide a method for forming a tungsten wiring, wherein an etch barrier layer is formed on an area where a metal wiring will be formed, using chlorine-based plasma so that the etch barrier layer is used as a mask upon forming a metal wiring, thereby eliminating a limitation on the thickness of the tungsten junction layer.

In accordance with the present invention, this object is accomplished by providing a method for forming a tungsten wiring, comprising the steps of: forming a metal wiring layer over a semiconductor substrate; forming a photoresist film pattern adapted to expose a portion of the metal wiring layer corresponding to a metal wiring which will be formed; curing the photoresist film pattern; selectively forming a metal thin film on the exposed portion of the metal wiring layer; treating the metal thin film by use of chlorine-based plasma, thereby forming a metal chlorine thin film; removing the photoresist film pattern; etching the metal wiring layer using the metal chloride thin film as a mask; and removing the metal chloride thin film.

Preferably, the metal wiring layer consists of a tungsten junction layer having a multilayer structure consisting of titanium and titanium nitride (Ti/TiN) films, and a tungsten film formed over the tungsten junction layer. The tungsten junction layer may have a thickness of 500 to 1,000 Å. The tungsten film may have a thickness of 3,000 to 5,000 Å. Preferably, the tungsten film is formed in accordance with a chemical vapor deposition method using a $WF_6$—$H_2$ reaction.

The photoresist film pattern may be formed by patterning a negative type photoresist film formed over the metal wiring layer. Preferably, the photoresist film pattern has a thickness of 0.5 to 0.7 $\mu$m.

The curing step may be carried out at a temperature of 120° to 200° C. The metal wiring thin film may be comprised of a copper thin film formed in accordance with a chemical vapor deposition method using a $Cu(HFA)_2$—$H_2$ reaction. Preferably, the chemical vapor method is carried out at a temperature of less than 200° C. and a pressure of 2 to 3 Torrs.

Preferably, the copper thin film has a thickness of 1,000 to 3,000 Å. The metal wiring thin film may be comprised of a copper chloride thin film formed to have a thickness larger than the copper thin film by 1.5 to 2 times by treating the copper thin film using chlorine-based plasma. The treatment using the chlorine-based plasma may be carried out using a pressure of 100 to 500 mTorrs and an electric power of 250 to 600 Watts. Preferably, the removal of the photoresist film pattern is carried out in accordance with a dry etch method using oxygen plasma.

The step of etching the metal wiring layer may be carried out in accordance with an etch method using fluorine-based plasma, a pressure of 100 to 300 mTorrs and an electric power of 100 to 600 Watts. Alternatively, the step of etching the metal wiring layer may be carried out in accordance with an etch method using chlorine plasma, a pressure of 100 to 200 mTorrs and an electric power of 100 to 300 Watts. The copper chloride thin film may be removed using a $PEt_3$.

In accordance with the method of the present invention, the copper chloride thin film has an increased thickness so that its thickness can be controlled. By virtue of the controlled thickness, the copper chloride thin film can serve as an etch barrier layer upon etching the tungsten layer and removing the tungsten junction layer. Accordingly, there is no problem even when a thin photoresist film pattern is used.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

Referring to FIGS. 1A to 1F, a method for forming a tungsten wiring in accordance with an embodiment of the present invention is illustrated.

Figure 1A:
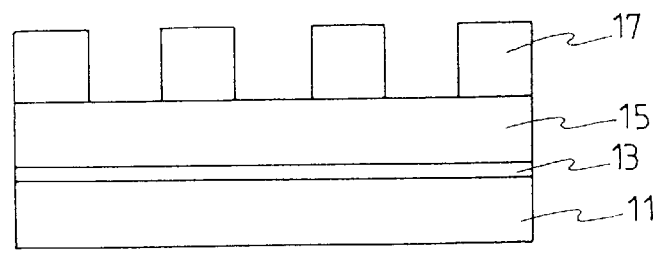
FIGS. 1A to 1F are sectional views respectively illustrating a method for forming a tungsten wiring in accordance with the present invention.

In accordance with this method, a tungsten junction layer 13 is first formed over a semiconductor substrate 11, as shown in FIG. 1A. Over the tungsten junction layer 13, a tungsten film 15 is formed. The tungsten junction layer 13 has a multilayer structure consisting of Ti and TiN films and a thickness of 500 to 1,000 Å. The tungsten film 15 is formed to have a thickness of 3,000 to 5,000 Å in accordance with a chemical vapor deposition (CVD) method using a $WF_6$—$H_2$ reaction. Thereafter, the formation of a photoresist film pattern 17 is carried out. The photoresist film pattern 17 is formed by forming a negative type photoresist film over the tungsten film 15 and then etching the photoresist film by use of a metal wiring mask. The photoresist film pattern 17 has a thickness of 0.5 to 0.7 $\mu$m. The photoresist film pattern 17 is subsequently cured at a temperature of 120° to 200° C.

Figure 1B:
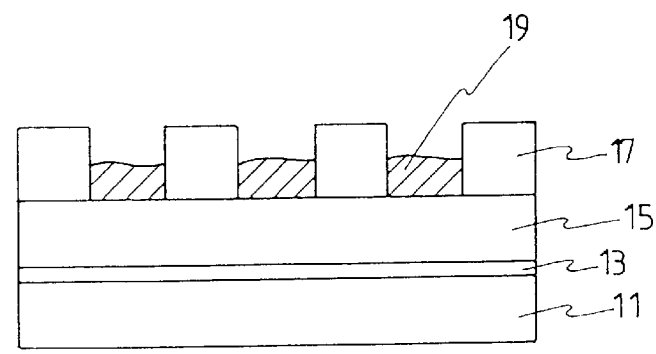
Figure 1C:
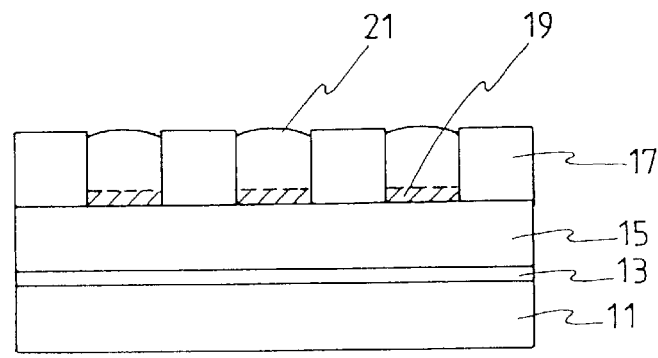

As shown in FIG. 1B, a copper thin film 19 is then selectively formed to a thickness of 1,000 to 3,000 Å on the exposed portion of the tungsten film 15 not covered with the photoresist film pattern 17. The formation of the copper thin film 19 is carried out at a temperature of less than 200° C. and a pressure of 2 to 3 Torrs in accordance with a CVD method using a $Cu(HFA)_2$—$H_2$ reaction.

The copper thin film 19 is subsequently treated using chlorine plasma, thereby forming a copper chloride (CuClx) thin film 21. In this case, the copper chloride thin film 21 has a thickness larger than that of the copper thin film 19 by 1.5 to 2 times. The plasma treatment is carried out using a pressure of 100 to 5,000 mTorrs and an electric power of 250 to 600 Watts.

As a source gas for the chlorine-based plasma, chlorine gas ($Cl_2$) may be used. The copper thin film 19 may remain in the copper chlorine thin film 21.

Figure 1D:
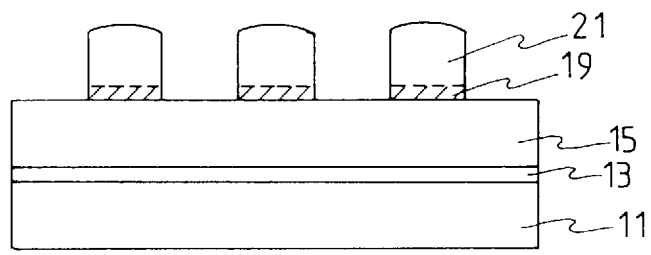

Thereafter, the photoresist film pattern 17 is removed, as shown in FIG. 1D. The removal of the photoresist film pattern 17 is achieved in accordance with a dry etch method using oxygen plasma.

Figure 1E:
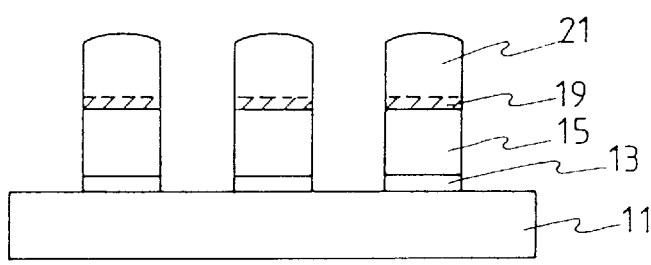

The tungsten film 15 is then etched using the copper chlorine thin film 21 as a first wiring mask, as shown in FIG. 1E. This etching is carried out by use of fluorine-based plasma. $SF_6$ and $C_2F_6$ gas is used as a source gas for the fluorine-based plasma. For the etching of the tungsten film 15, a pressure of 100 to 300 mTorrs and an electric power of 100 to 600 Watts are used.

Subsequently, the tungsten junction layer 13 is etched using the patterned tungsten film 15 as a second wiring mask. This etching is carried out using chlorine plasma, a pressure of 10 to 200 mTorrs and an electric power of 100 to 300 Watts.

Figure 1F:
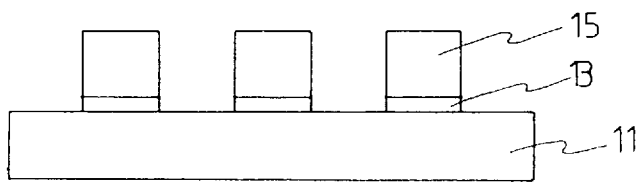

Finally, the copper chlorine thin film 21 is removed, thereby forming a tungsten wiring, as shown in FIG. 1F. The removal of the copper chlorine thin film 21 is achieved using triethyl phosphine ($PEt_3$:$P(C_2H_5)_3$).

As apparent from the above description, the present invention provides a method for forming a tungsten wiring, wherein an etch barrier layer is formed on an area where a metal wiring will be formed, using chlorine-based plasma so that the etch barrier layer is used as a mask upon forming a metal wiring, thereby eliminating a limitation on the thickness of the tungsten junction layer. Accordingly, the method of the present invention achieves an improvement in the reliability of semiconductor devices and a high integration of semiconductor devices.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for forming a tungsten wiring, comprising the steps of:
    forming a metal wiring layer over a semiconductor substrate;
    forming a photoresist film pattern adapted to expose a portion of the metal wiring layer corresponding to a metal wiring which will be formed;
    curing the photoresist film pattern;
    selectively forming a metal thin film on the exposed portion of the metal wiring layer;
    treating the metal thin film by use of chlorine-based plasma, thereby forming a metal chlorine thin film;
    removing the photoresist film pattern;
    etching the metal wiring layer using the metal chloride thin film as a mask; and
    removing the metal chloride thin film.

2. The method in accordance with claim 1, wherein the metal wiring layer consists of a tungsten junction layer having a multilayer structure consisting of titanium and titanium nitride (Ti/TiN) films, and a tungsten film formed over the tungsten junction layer.

3. The method in accordance with claim 2, wherein the tungsten junction layer has a thickness of 500 to 1,000 Å.

4. The method in accordance with claim 2, wherein the tungsten film has a thickness of 3,000 to 5,000 Å.

5. The method in accordance with claim 2, wherein the tungsten film is formed in accordance with a chemical vapor deposition method using a $WF_6$—$H_2$ reaction.

6. The method in accordance with claim 1, wherein the photoresist film pattern is formed by patterning a negative type photoresist film formed over the metal wiring layer.

7. The method in accordance with claim 1, wherein the photoresist film pattern has a thickness of 0.5 to 0.7 $\mu$m.

8. The method in accordance with claim 1, wherein the curing step is carried out at a temperature of 120° to 200° C.

9. The method in accordance with claim 1, wherein the metal wiring thin film is comprised of a copper thin film formed in accordance with a chemical vapor deposition method using a $Cu(HFA)_2$—$H_2$ reaction.

10. The method in accordance with claim 9, wherein the chemical vapor method is carried out at a temperature of less than 200° C. and a pressure of 2 to 3 Torrs.

11. The method in accordance with claim 9, wherein the copper thin film has a thickness of 1,000 to 3,000 Å.

12. The method in accordance with claim 9, wherein the metal wiring thin film is comprised of a copper chloride thin film formed to have a thickness larger than the copper thin film by 1.5 to 2 times by treating the copper thin film using chlorine-based plasma.

13. The method in accordance with claim 12, wherein the treatment using the chlorine-based plasma is carried out using a pressure of 100 to 500 mTorrs and an electric power of 250 to 600 Watts.

14. The method in accordance with claim 1, wherein the removal of the photoresist film pattern is carried out in accordance with a dry etch method using oxygen plasma.

15. The method in accordance with claim 1, wherein the step of etching the metal wiring layer is carried out in accordance with an etch method using fluorine-based plasma.

16. The method in accordance with claim 1, wherein the step of etching the metal wiring layer is carried out using a pressure of 100 to 300 mTorrs and an electric power of 100 to 600 Watts.

17. The method in accordance with claim 1, wherein the step of etching the metal wiring layer is carried out in accordance with an etch method using chlorine plasma.

18. The method in accordance with claim 1, wherein the step of etching the metal wiring layer is carried out using a pressure of 100 to 200 mTorrs and an electric power of 100 to 300 Watts.

19. The method in accordance with claim 12, wherein the copper chloride thin film is removed using a $PEt_3$.

20. The method in accordance with claim 15, wherein the step of etching the metal wiring layer with a fluorine-based plasma is carried out using a pressure of 100 to 300 mTorrs and an electric power of 100 and 600 Watts.

21. The method in accordance with claim 15, wherein the step of etching the metal wiring layer comprises a second etching using a chlorine plasma.

22. The method of claim 21, wherein the second step of etching the metal wiring layer is carried out using a pressure of 100 to 200 mTorrs and an electric power of 100 to 300 Watts.

* * * * *